(12) United States Patent
Kwon et al.

(10) Patent No.: US 8,580,636 B2
(45) Date of Patent: Nov. 12, 2013

(54) HIGHLY INTEGRATED PHASE CHANGE MEMORY DEVICE HAVING MICRO-SIZED DIODES AND METHOD FOR MANUFACTURING THE SAME

(75) Inventors: Ki Sung Kwon, Gyeonggi-do (KR); Jun Hyung Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 77 days.

(21) Appl. No.: 13/404,451

(22) Filed: Feb. 24, 2012

(65) Prior Publication Data

US 2012/0156853 A1    Jun. 21, 2012

Related U.S. Application Data

(62) Division of application No. 12/344,805, filed on Dec. 29, 2008, now Pat. No. 8,129,708.

(30) Foreign Application Priority Data

May 27, 2008   (KR) .................. 10-2008-0049064

(51) Int. Cl.
*H01L 21/8234*   (2006.01)

(52) U.S. Cl.
USPC ............................................. 438/237; 257/5

(58) Field of Classification Search
USPC .................. 257/5, 288, E27.057, E27.073, 257/E27.016, E27.017; 438/154, 197, 237, 438/382, 601
See application file for complete search history.

(56) References Cited

U.S. PATENT DOCUMENTS

| | | | |
|---|---|---|---|
| 6,104,061 A | | 8/2000 | Forbes et al. |
| 6,731,535 B1 * | | 5/2004 | Ooishi et al. .................. 365/171 |
| 6,750,101 B2 | | 6/2004 | Lung |
| 7,638,788 B2 * | | 12/2009 | Ahn et al. .......................... 257/3 |
| 2007/0111487 A1 * | | 5/2007 | Kim et al. ...................... 438/478 |
| 2007/0158634 A1 * | | 7/2007 | Ooishi ............................... 257/5 |
| 2008/0093590 A1 * | | 4/2008 | Ahn et al. .......................... 257/3 |
| 2008/0142776 A1 * | | 6/2008 | Seidl ................................. 257/4 |
| 2008/0149910 A1 | | 6/2008 | An et al. |
| 2010/0127234 A1 * | | 5/2010 | Park ................................. 257/4 |

FOREIGN PATENT DOCUMENTS

| | | |
|---|---|---|
| JP | 2005-071500 A | 3/2005 |
| KR | 10-0689831 B1 | 3/2007 |

OTHER PUBLICATIONS

USPTO RR mailed Sep. 27, 2010 in connection with U.S. Appl. No. 12/344,805.
USPTO NFOA mailed Nov. 18, 2010 in connection with U.S. Appl. No. 12/344,805.
USPTO FOA mailed May 10, 2011 in connection with U.S. Appl. No. 12/344,805.
USPTO NOA mailed Oct. 27, 2011 in connection with U.S. Appl. No. 12/344,805.

* cited by examiner

*Primary Examiner* — Vongsavanh Sengdara
(74) *Attorney, Agent, or Firm* — Ladas & Parry LLP

(57) ABSTRACT

A highly integrated phase change memory device and a method for manufacturing the same is disclosed. The highly integrated phase change memory device includes a semiconductor substrate having a cell area and a peripheral area with impurity regions formed in the cell area and extending in parallel to each other in a first direction to form a striped pattern. A gate electrode is formed in the peripheral area and dummy gate electrodes are formed in the cell area and extending in a second direction perpendicular to the first direction of the impurity regions. An interlayer dielectric layer pattern exposes portions of the cell area and the peripheral area and a PN diode is formed in a space defined by a pair of dummy gate electrodes and a pair of interlayer dielectric layer patterns.

4 Claims, 8 Drawing Sheets

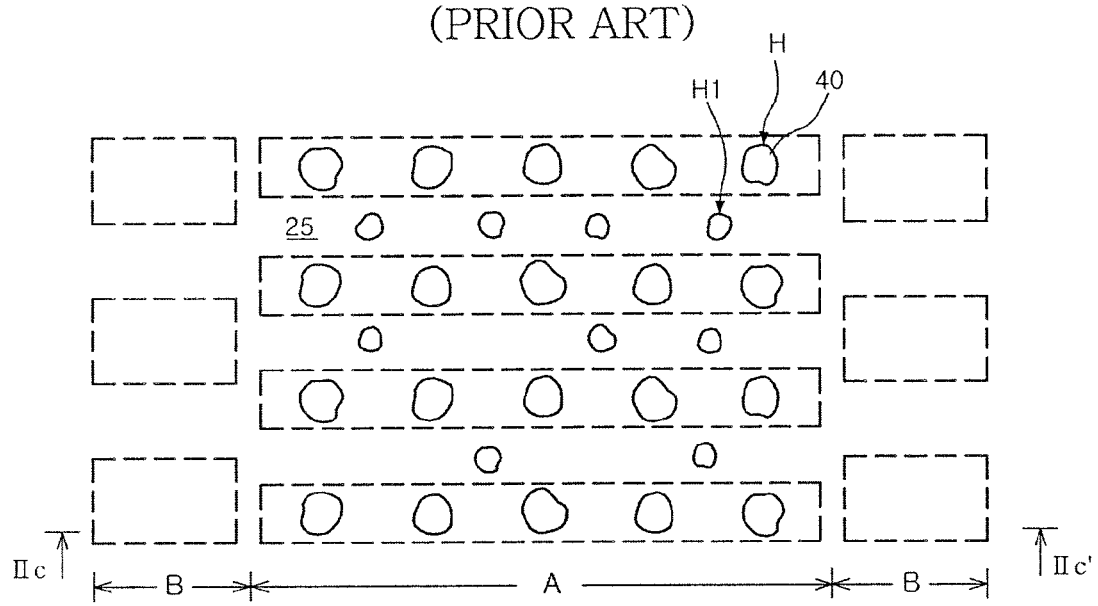

HIGHLY INTEGRATED PHASE CHANGE MEMORY DEVICE HAVING MICRO-SIZED DIODES AND METHOD FOR MANUFACTURING THE SAME

CROSS-REFERENCES TO RELATED APPLICATION

The present application claims priority under 35 U.S.C. 119(a) to Korean application number 10-2008-0049064, filed on May 27, 2008, in the Korean Patent Office, which is incorporated by reference in its entirety as if set forth in full.

BACKGROUND OF THE INVENTION

1. Technical Field

The embodiments described herein generally relate to a highly integrated phase change memory device and a method for manufacturing the same and, more particularly, to a highly integrated phase change memory device having a micro-sized diode and a method for manufacturing the same.

2. Related Art

Generally, semiconductor memory devices are classified as volatile semiconductor memory devices, such as a DRAM device or an SRAM device, which cannot retain data stored if power to the devices is shut off, and non-volatile semiconductor memory devices, such as an EEPROM device, which can retain data stored even if power is shut off to the devices. A flash memory device, which is classified as a non-volatile semiconductor memory device, is used primarily for electronic appliances such as digital cameras, mobile phones, or MP3 players. However, new semiconductor memory devices, such as an MRAM (magnetic RAM) device, an FRAM (ferroelectric RAM) device, and a PRAM (phase change RAM) device have been developed to replace flash memory devices since flash memory devices requires a lot of time to record or read data.

Among those semiconductor memory devices mentioned above, the PRAM device stores data using a difference in resistance between an amorphous state and a crystal state resulting from phase transition of a chalcogenide compound. The PRAM device stores data as a "0" and "1" based on a reversible phase transition of a phase change material layer including the chalcogenide compound Ge—Sb—Te (GST) according to an amplitude and a length of a pulse applied thereto. More specifically, a reset current is required for transitioning the phase change material layer into the amorphous state that has a higher resistance and a set current is required for transitioning the phase change material layer into the crystal state that has a lower resistance. The reset and set currents are transferred to the phase change material layer via a switching device and a lower electrode contact that are positioned below the phase change material layer to activate the phase change.

Recently, as with other memory devices, the phase change memory device has become more highly integrated and a vertical diode having an area narrower than that of a transistor is employed in the phase change memory device as a switching device.

Hereinafter, a method for manufacturing a vertical diode used in a conventional phase change memory device will be described with reference to FIGS. 1a to 1c and 2a to 2c.

Referring to FIGS. 1a and 2a, a semiconductor substrate 10 having a cell area A and a peripheral area B is prepared. An n-type impurity region 15 is then formed in the cell area A. A gate material layer (not shown) is subsequently formed on the semiconductor substrate 10 having the impurity region 15. After formation of the gate material layer, the gate material layer is partially removed such that the gate material layer remains on the peripheral area B to form a gate electrode 20.

Referring to FIGS. 1b and 2b, an interlayer dielectric layer 25 is formed on the semiconductor substrate 10. A mask pattern 30 having a plurality of openings 32 is then formed on the interlayer dielectric layer 25 to expose portions of the impurity region 15 formed in the cell area A. The openings 32 determine the size of the diode to be formed later. Accordingly, the openings 32 must be arranged having a small pitch with small diameters so that a maximum number of openings 32 can be formed in the cell area A.

As shown in FIGS. 1c and 2c, the interlayer dielectric layer 25 is etched using the mask pattern 30 as an etch mask to form contact holes H for exposing the impurity region 15. An SEG (selective epitaxial growth) layer 40a is then grown to fill the contact holes H with the SEG layer 40a. The SEG layer 40a serves as an n-type impurity layer since the SEG layer 40a is grown from the n-type impurity region 15. Then, p-type impurities are implanted into the n-type SEG layer 40a to form a p-type impurity region 40b and thereby forming a PN diode 40.

As mentioned above, according to the conventional phase change memory device, the diode contact holes H must be arranged at a small pitch with small diameters to obtain a highly integrated phase change memory device. In the typical phase change memory device, a unit cell of the cell area A has an area of 1F2, which is smaller than an area (6F2) of a unit cell for a DRAM device. As a result, there has been suggested a method of using a quadrupole type aperture (not shown) to form the contact holes of the phase change memory device because the quadrupole type aperture exhibits a higher optical efficiency than that of a dipole type aperture used for forming storage node contact holes of the DRAM device. In other words, although the dipole type aperture is advantageous in supplying light over a relatively large area, a smaller amount of light is supplied to a narrow area. For this reason, if the diode contact hole mask pattern 30 of the phase change memory device is formed using the dipole type aperture, the interlayer dielectric layer 25 cannot be sufficiently exposed.

Meanwhile, a large amount of light can be supplied to the semiconductor substrate using the quadrupole type aperture. The amount of light supplied using the quadrupole type aperture is approximately two times greater than the amount of light supplied to the semiconductor substrate using the dipole type aperture. Thus, a relatively greater amount of light can be supplied to the narrow area if the quadrupole type aperture is adopted in the phase change memory device. As a result, the mask pattern 30 can sufficiently expose the interlayer dielectric layer 25. However, if an upper side of the mask pattern 30 is excessively exposed to the light, the mask pattern 30 may become deformed so that the shape of the contact hole may become deformed (see, FIG. 1c).

Additionally, as mentioned above, since the diode contact hole H is formed in a relatively narrow area (1F2), the contact hole may be affected by the light used for forming an adjacent contact hole. Such a phenomenon is called a "side robe phenomenon". When the side robe phenomenon occurs, a dummy contact hole H1 may form in an undesired region. If a dummy contact hole H1 is formed as mentioned above, a diode is formed in the dummy contact hole H1. This causes an electrical defect with respect to a normal diode adjacent to the diode.

SUMMARY

A high integrated phase change memory device capable of preventing a shape of a diode from being deformed is described herein.

A method for manufacturing the high integrated phase change memory device is described herein.

According to one embodiment of the present invention, a highly integrated phase change memory device comprises a semiconductor substrate formed to have a plurality of conductive areas extending in parallel to each other in a first direction while forming stripe patterns, a plurality of first stripe patterns formed on the semiconductor substrate and extending in parallel to each other in a second direction perpendicularly to the first direction, a plurality of second stripe patterns formed to expose the conductive areas while forming a lattice structure together with the first stripe patterns, and a PN diode formed in a space defined by a pair of first stripe patterns and a pair of second stripe patterns to make contact with the conductive areas.

According to another embodiment of the present invention, a highly integrated phase change memory device comprises a semiconductor substrate formed to have a cell area and a peripheral area, a plurality of impurity regions formed on the cell area of the semiconductor substrate and extending in parallel to each other in a first direction while forming stripe patterns, a gate electrode formed on the peripheral area of the semiconductor substrate, a plurality of dummy gate electrodes formed on the cell area of the semiconductor substrate while being aligned on a same plane with the gate electrode, and extending in parallel to each other in a second direction perpendicularly to the first direction, an interlayer dielectric layer pattern formed to expose the cell area and the peripheral area while forming a lattice structure together with the dummy gate electrodes, and a PN diode formed in a space defined by a pair of dummy gate electrodes and a pair of interlayer dielectric layer patterns to make contact with the cell areas and the peripheral areas.

According to still another embodiment of the present invention, a highly integrated phase change memory device is manufactured through the following method. First, a semiconductor substrate formed to have a cell area and a peripheral area is prepared. Then, a plurality of impurity regions extending in parallel to each other in a first direction while forming stripe patterns are formed on the cell area of the semiconductor substrate. Next, a gate electrode is formed on the peripheral area of the semiconductor substrate and, at the same time, a plurality of dummy gate electrodes are formed on the cell area of the semiconductor substrate. The dummy gate electrodes extend in parallel to each other in a second direction perpendicularly to the first direction. Then, an interlayer dielectric layer pattern formed to form a lattice structure together with the dummy gate electrodes is formed such that the interlayer dielectric layer pattern covers the peripheral area and exposes the impurity regions. After that, a PN diode is formed in the exposed impurity regions.

These and other features are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 1a to 1c are plan views showing a method for manufacturing a diode of a conventional phase change memory device;

FIGS. 2a to 2c are sectional views showing a method for manufacturing a diode of a conventional phase change memory device, in which FIG. 2a is a sectional view taken along line IIa-IIa' of FIG. 1a, FIG. 2b is a sectional view taken along line IIb-IIb' of FIG. 1b, and FIG. 2c is a sectional view taken along line IIc-IIc' of FIG. 1c;

FIGS. 4a to 4d are sectional views showing a method for manufacturing a diode of a phase change memory device according to one embodiment of the present invention, in which FIG. 4a is a sectional view taken along line IVa-IVa' of FIG. 3a, FIG. 4b is a sectional view taken along line IVb-IVb' of FIG. 3b, FIG. 4c is a sectional view taken along line IVc-IVc' of FIG. 3c, and FIG. 4d is a sectional view taken along line IVd-IVd' of FIG. 3d.

DETAILED DESCRIPTION

Figure 1A:
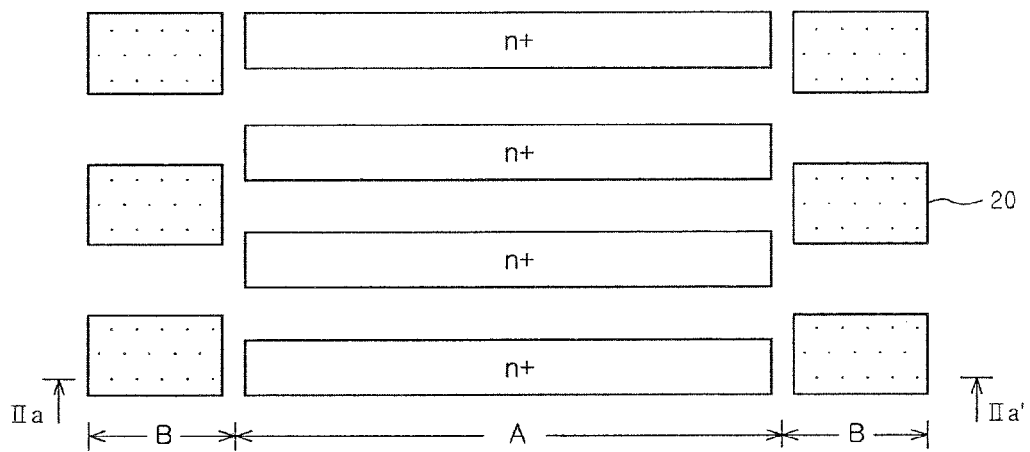
Figure 1B:
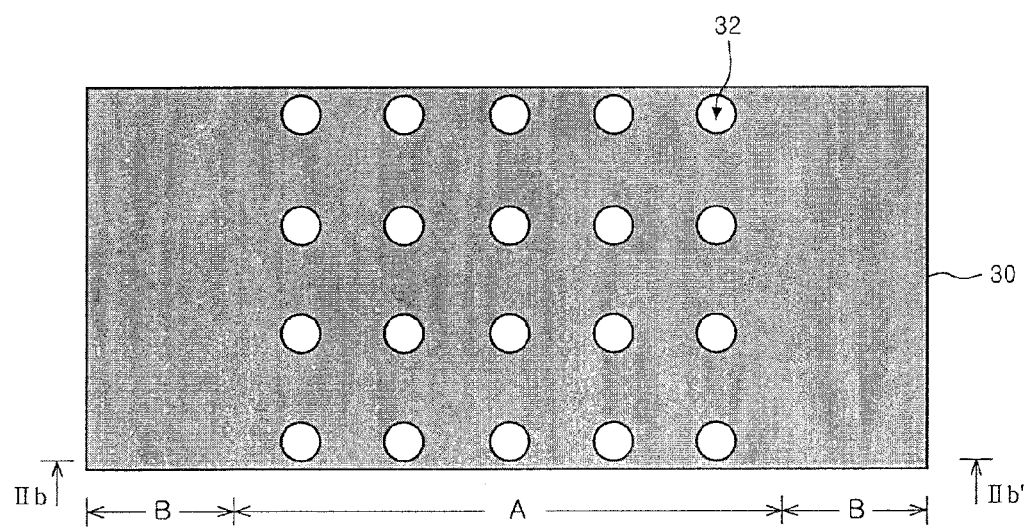
Figure 2A:
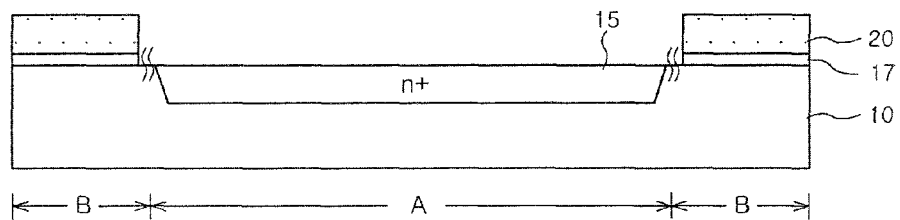
Figure 2B:
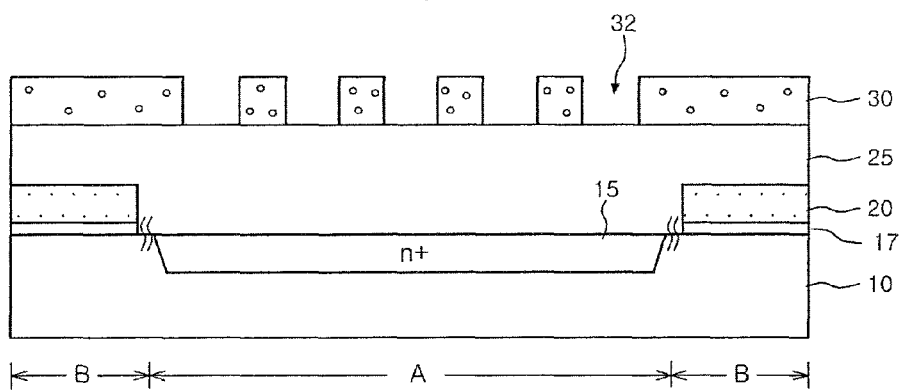
Figure 2C:
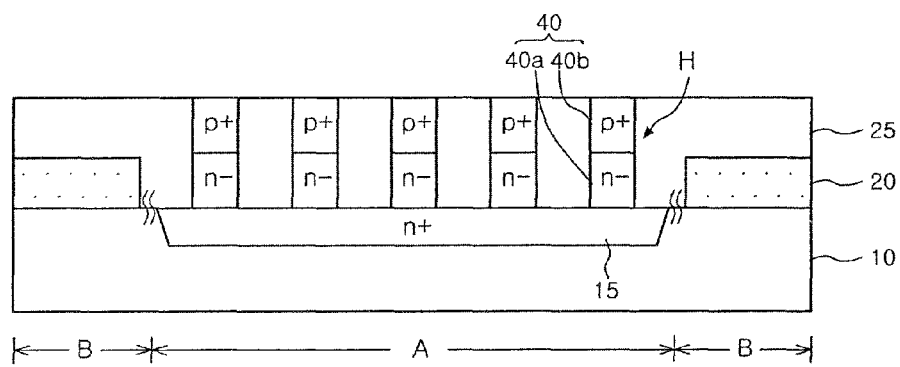
Figure 3A:
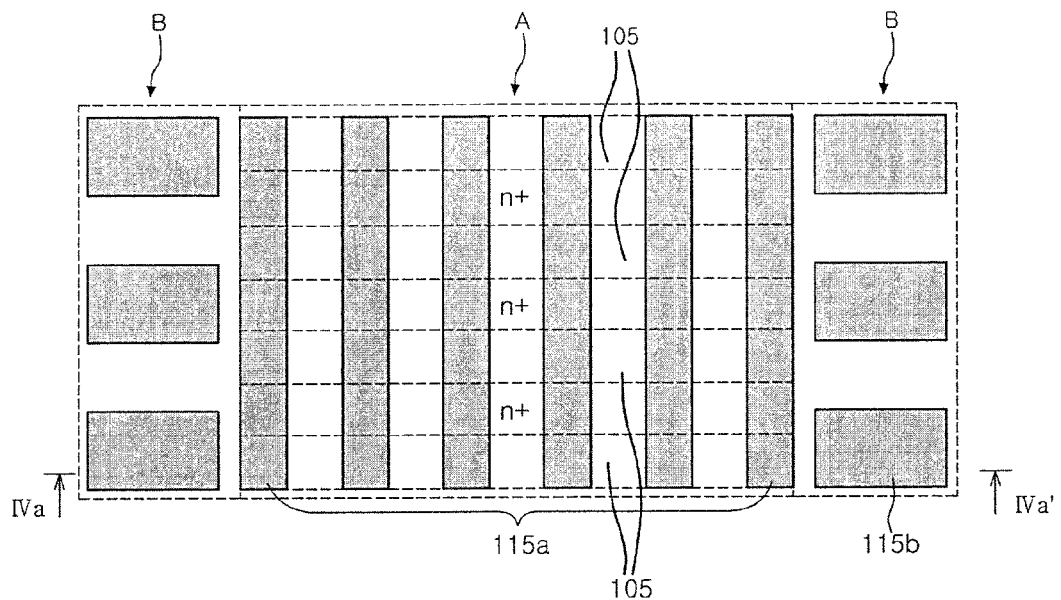
FIGS. 3a to 3d are plan views shown for explaining methods for manufacturing a diode of a phase change memory device according to one embodiment of the present invention.
Figure 4A:
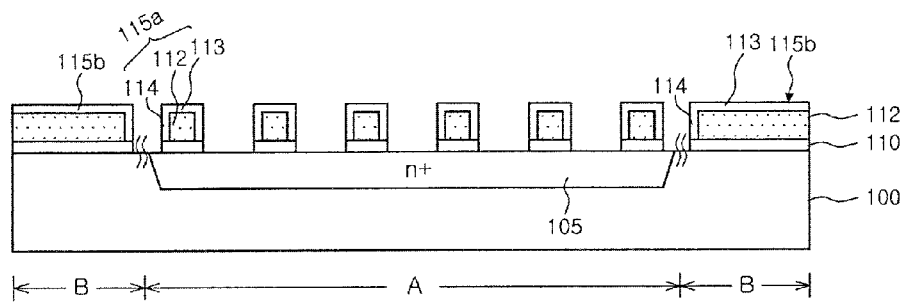

Referring to FIGS. 3a and 4a, a semiconductor substrate 100 is provided for fabrication of a phase change memory device. The semiconductor substrate 100 is divided into a cell area A and a peripheral area B. As is generally known in the art, many phase change patterns (not shown) and many switching devices for selectively phase-changing the phase change patterns are formed in the cell area A of the phase change memory device. Driving devices for the switching devices that are formed in the cell area A are provided in the peripheral area B. In a typical highly integrated phase change memory device, a diode having a small area can be used as the switching device and a MOS transistor can be used as the driving device.

N-type impurities are selectively implanted into the cell area A of the semiconductor substrate 100 to form an impurity region 105. The n-type impurity region 105 serves as a word line in the phase change memory device. A plurality of n-type impurity regions 105 can be formed in the cell area A as shown in FIG. 3A. The n-type impurity regions 105 can be arranged in a striped pattern extending in a first direction and being spaced parallel and apart from each other. The n-type impurities for the n-type impurity region 105 include boron (B) ions, or arsenic (As) ions.

Next, a gate insulating layer 110 is formed on the entire surface of the semiconductor substrate 100 having the cell region A and the peripheral region B. A gate electrode layer 112 and a hard mask layer 113 are then sequentially formed on the gate insulating layer 110. For example, the gate electrode layer 112 includes a doped polysilicon layer, a silicide layer, a metal layer, or a stacked structure thereof. The hard mask layer 113 may include a silicon nitride layer. A first mask pattern (not shown) is formed on the gate electrode layer 112 through a photolithography process. The first mask pattern serves as a mask for forming a gate electrode in the peripheral area B. According to an embodiment of the present invention, the first mask pattern is used to form the gate electrode in the peripheral area B and to form a dummy gate electrode in the cell area A. The hard mask layer 113 and the gate electrode layer 112 are then etched using the first mask pattern as an etch mask to form a dummy gate electrode 115a in the cell area A and a gate electrode 115b in the peripheral area B. The dummy gate electrode 115a and the gate electrode 115b can be further formed by forming an insulation spacer 114 at sidewalls of the remaining hard mask layer 113 and the gate electrode layer 112.

Accordingly, a plurality of dummy gate electrodes 115a can be formed parallel to each other in the cell area A. The dummy gate electrodes 115a are arranged in a striped pattern extending in a second direction that is perpendicular to the impurity regions 105 that extend in the first direction. An interval between the dummy gate electrodes 115a can be determined by taking the number of phase change patterns to be integrated on the cell area A into consideration. In addition, an additional lithography process for forming the dummy gate electrodes 115a is not necessary since the dummy gate electrodes 115a are formed together with the gate electrodes 115b using one mask pattern. The first mask pattern is then removed through a removal process generally known in the art.

Figure 3B:
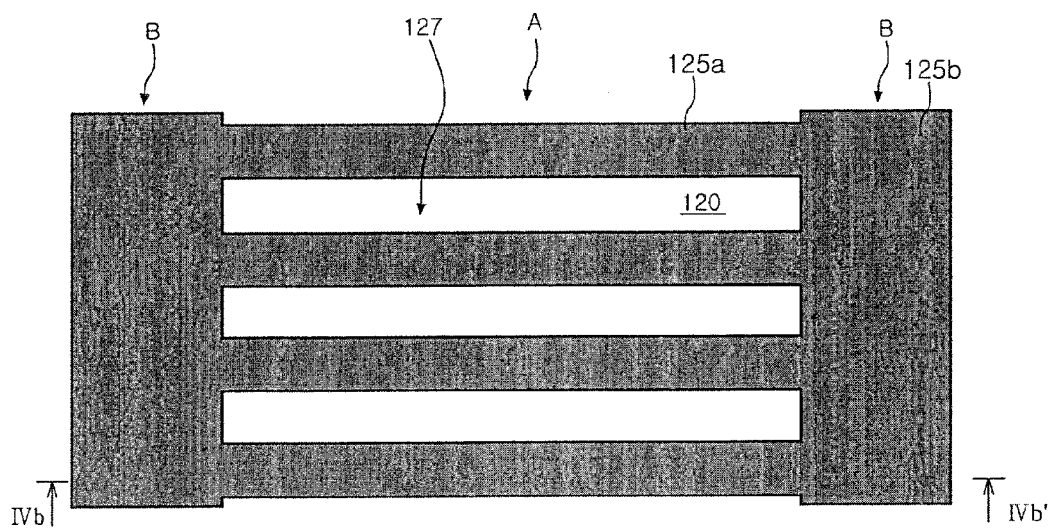
Figure 4B:
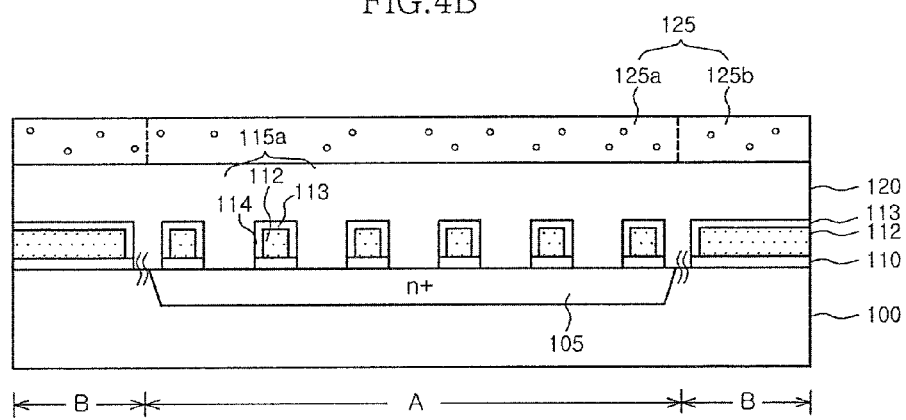

As shown in FIGS. 3b and 4b, an interlayer dielectric layer 120 is formed on the semiconductor substrate 100 including the gate electrode 115b and the dummy gate electrodes 115a. The interlayer dielectric layer 120 may include silicon oxide components and formed as a single layer or a multi-layer. The interlayer dielectric layer 120 has a thickness sufficient for filling a gap left between the dummy gate electrodes 115a. An upper surface of the interlayer dielectric layer 120 can be subsequently planarized through a polishing process.

A second mask pattern 125 is formed on the interlayer dielectric layer 120 through a photolithography process. The second mask pattern 125 according to an embodiment of the present invention, serves as a mask to define contact holes. Accordingly, the second mask pattern 125 exposes a predetermined portion of the interlayer dielectric layer 120 corresponding to the impurity region 105 while blocking the peripheral area B. Thus, the second mask pattern 125 has slits 127 for exposing the predetermined portion of the impurity region 105 as shown in FIG. 3B. In FIG. 4b, reference numeral 125a refers to the second mask pattern aligned on the cell area A and reference numeral 125b refers to the second mask pattern aligned on the peripheral area B.

Figure 3C:
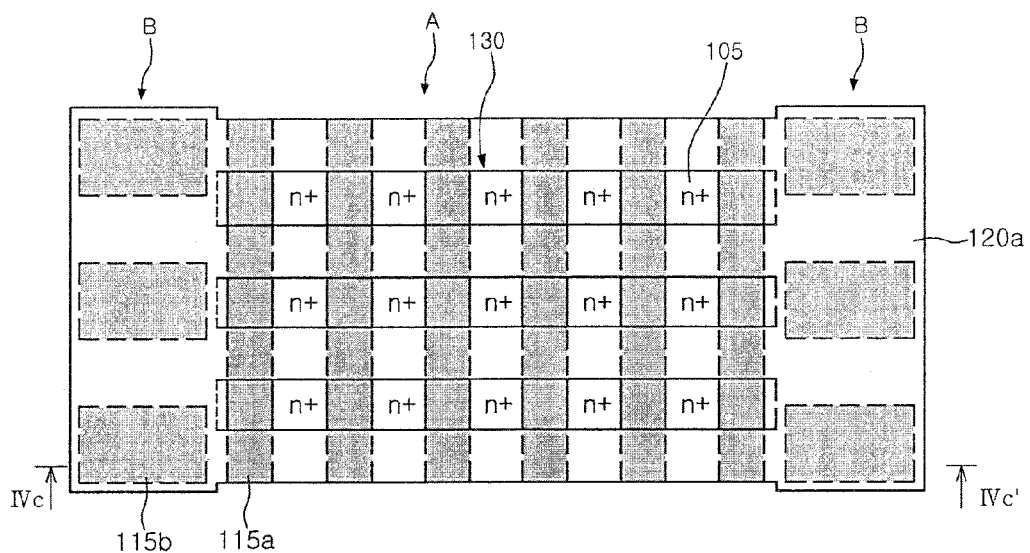
Figure 3D:
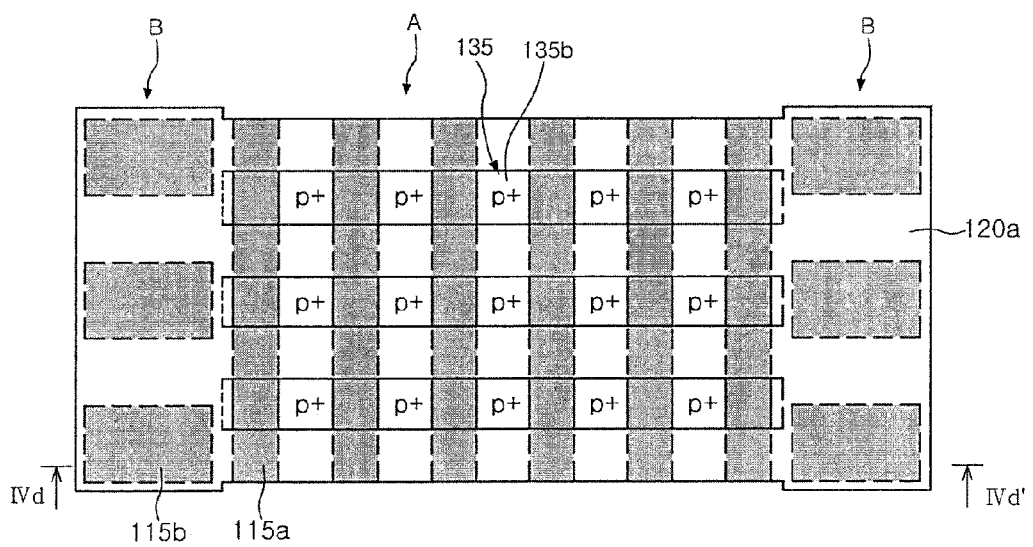
Figure 4C:
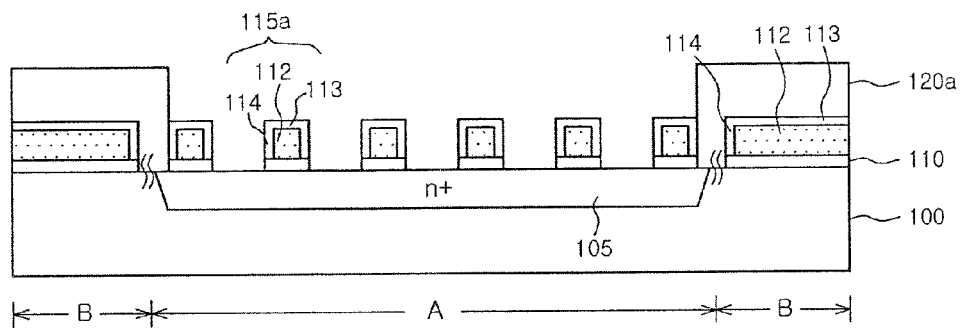

Referring to FIGS. 3c and 4c, the exposed interlayer dielectric layer 120 is etched using the second mask 125 (see, FIGS. 3b and 4b) as an etch mask to form an interlayer dielectric layer pattern 120a. The second mask pattern 125 is then removed through a removal process generally known in the art. In FIGS. 3c and 3d, the dashed lines indicate those areas and structures that are formed beneath the interlayer dielectric layer pattern 120a and thus hidden from view. That is, the interlayer dielectric layer pattern 120a is formed over the entire structure of FIGS. 3c and 3d except for the regions designated by solid lines. The interlayer dielectric layer pattern 120a blocks the peripheral area B and the exposed portions of the impurity region 105 through the interlayer dielectric layer pattern 120a forms a lattice structure in conjunction with the dummy gate electrodes 115a in the cell area A. That is, the interlayer dielectric layer pattern 120a has a striped structure extending perpendicularly to a direction of formation for the dummy gate electrodes 115a. Thus, predetermined portions of the impurity region 105 are exposed at a predetermined interval according to the dummy gate electrodes 115a and the interlayer dielectric layer pattern 120a formed in the cell area A, which are aligned in the lattice structure, so that contact holes 130 are formed in a self-alignment scheme.

Figure 4D:
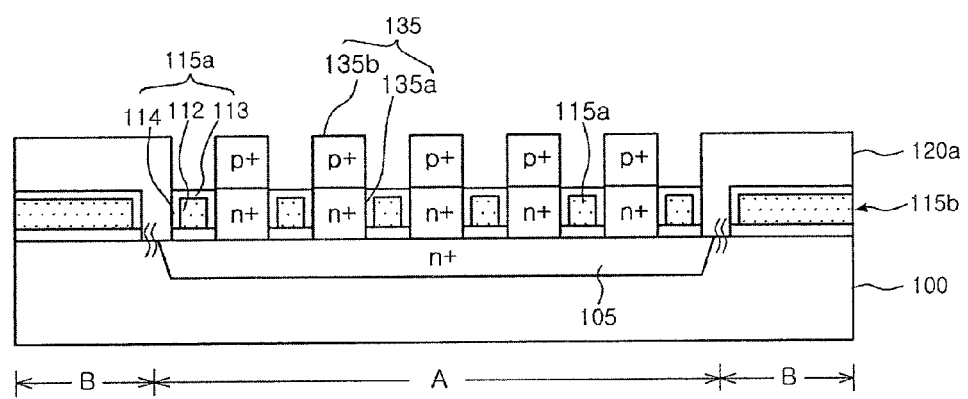

Referring to FIGS. 3d and 4d, an n-type SEG layer 135a is grown from the impurity region 105 through a selective epitaxial growth scheme. The n-type SEG layer 135a may be formed to have a height substantially the same as a height of the interlayer dielectric layer pattern 120a. N-type impurities can also be additionally doped when forming the n-type SEG layer 135a. After initial formation of the n-type SEG layer 135a, p-type impurities are doped into the n-type SEG layer 135a to form a p-type impurity region 135b, thereby forming a PN diode 135.

Although not shown in the drawings, a bottom electrode, a phase change pattern, and a top electrode are formed on the PN diode 135.

Figure 5:
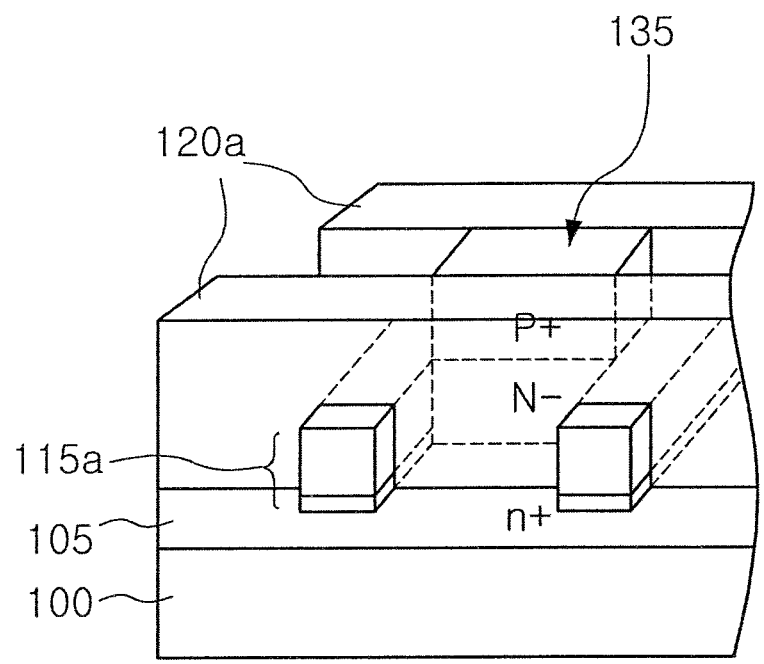
FIG. 5 is a perspective view showing a diode of a phase change memory device according to one embodiment of the present invention.

FIG. 5 is a perspective view showing the diode of the phase change memory device according to an embodiment of the present invention.

Referring to FIG. 5, the diodes 135 are formed in spaces (holes) defined by a pair of dummy gate electrodes 115a extending in the first direction and a pair of interlayer dielectric layer patterns 120a extending in the second direction. Thus, the diodes 135 are insulated from each other in the first direction by the interlayer dielectric layer patterns 120a and are insulated from each other in the second direction by the dummy gate electrodes 115a. Accordingly, the diodes 135 can be sufficiently insulated from each other since the dummy gate electrodes 115a are covered with the hard mask layer and the spacer in a floating state.

According to one embodiment of the present invention, the dummy gate electrode 115a extends perpendicular to the impurity region 105, which serves as the word line, and is formed in the cell area A when the gate electrode is formed in the peripheral area B. Diode contact holes for forming the diodes are then formed in a self-alignment scheme instead of directly forming the contact holes using the interlayer dielectric layer pattern 120a extending perpendicularly to the dummy gate electrode 115a to expose the impurity region 105.

Therefore, the diode contact holes can be formed through the self alignment scheme so that an influence upon the aperture can be reduced by forming striped patterns without the need for using a mask pattern having openings aligned at a small pitch with small diameters. As a result, deformation of the contact hole shape caused by defective exposure process can be prevented.

According to one embodiment of the present invention, the dummy gate electrode is formed in the cell area while the gate electrode is formed in the peripheral area. The diode contact holes are then formed through the self alignment scheme by forming the interlayer dielectric layer patterns perpendicularly to the dummy gate electrodes to expose the impurity region without directly forming the contact holes for the diodes.

Influence upon the aperture can be reduced since the diode contact holes can be formed through the self alignment scheme by forming the striped patterns without the need for using a mask pattern having openings aligned at a small pitch with small diameters. Thus, deformation of the contact hole shape caused by the defective exposure process can be prevented. Accordingly, various types of apertures can be used.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A method for manufacturing a high integrated phase change memory device, the method comprising:
providing a semiconductor substrate having a cell area and a peripheral area defined therein;
forming a plurality of impurity regions formed in the cell area of the semiconductor substrate and the plurality of impurity regions extending parallel to each other in a first direction thereby forming a striped pattern;

forming a gate electrode in the peripheral area of the semiconductor substrate and simultaneously forming a plurality of dummy gate electrodes in the cell area of the semiconductor substrate, wherein the dummy gate electrodes extend parallel to each other in a second direction that is perpendicular to the first direction;

forming an interlayer dielectric layer pattern that forms a lattice structure in conjunction with the dummy gate electrodes such that the interlayer dielectric layer pattern covers the peripheral area and exposes portions of the plurality of impurity regions; and forming a PN diode in the exposed portions of the plurality of impurity regions.

2. The method of claim 1, wherein the forming of the gate electrode and the dummy gate electrode includes:

sequentially forming a gate insulating layer, a gate electrode layer, and a hard mask layer on the semiconductor substrate;

forming a first mask pattern on the hard mask layer;

patterning the hard mask layer and the gate electrode layer using the first mask pattern as an etch mask;

removing the first mask pattern; and forming an insulating spacer on a sidewall of the patterned hard mask layer and the gate electrode layer.

3. The method of claim 1, wherein the forming of the interlayer dielectric layer pattern includes:

forming an interlayer dielectric layer on a resultant structure of the semiconductor substrate;

forming a second mask pattern to expose a predetermined portion of the interlayer dielectric layer corresponding to the plurality of impurity regions;

etching the interlayer dielectric layer using the second mask pattern as an etch mask; and removing the second mask pattern.

4. The method of claim 1, wherein the forming of the diode includes:

forming an n-type SEG layer by growing the exposed portions of the plurality of impurity regions; and forming p-type impurity regions in the n-type SEG layer.

* * * * *